United States Patent
Lee et al.

(10) Patent No.: US 10,541,690 B2
(45) Date of Patent: Jan. 21, 2020

(54) METHOD AND DEVICE TO ALIGN PHASES OF CLOCK SIGNALS

(71) Applicant: SAMSUNG ELECTRONICS CO., LTD., Suwon-si, Gyeonggi-Do (KR)

(72) Inventors: Sangheon Lee, Hwaseong-si (KR); Jaehyun Kim, Seoul (KR); Kiyoung Choi, Seoul (KR); Soojung Ryu, Hwaseong-si (KR)

(73) Assignees: SAMSUNG ELECTRONICS CO., LTD., Suwon-si, Gyeonggi-Do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 146 days.

(21) Appl. No.: 15/443,060

(22) Filed: Feb. 27, 2017

(65) Prior Publication Data

US 2017/0250695 A1   Aug. 31, 2017

Related U.S. Application Data

(60) Provisional application No. 62/301,089, filed on Feb. 29, 2016.

(30) Foreign Application Priority Data

Jun. 29, 2016   (KR) .................. 10-2016-0081544

(51) Int. Cl.
*H03L 7/00*   (2006.01)
*H03L 7/081*   (2006.01)
(Continued)

(52) U.S. Cl.
CPC .............. *H03L 7/0812* (2013.01); *G06F 1/08* (2013.01); *G06F 1/12* (2013.01); *H03L 7/091* (2013.01)

(58) Field of Classification Search
CPC ......... H03L 7/0812; H03L 7/091; G06F 1/12; G06F 1/08
(Continued)

(56) References Cited

U.S. PATENT DOCUMENTS 7,523,365 B2   4/2009   Aldereguia et al.
7,739,537 B2   6/2010   Albonesi et al.
(Continued)

FOREIGN PATENT DOCUMENTS

CN   101478308   7/2009
JP   2008-092268   4/2008
(Continued)

OTHER PUBLICATIONS

Fick, David et al., "Centip3De: A Cluster-Based NTC Architecture With 64 ARM Cortex-M3 Cores in 3D Stacked 130 nm CMOS", IEEE Journal of Solid-State Circuits, vol. 48, No. 1, Jan. 2013, pp. 104-117.
(Continued)

*Primary Examiner* — Metasebia T Retebo
(74) *Attorney, Agent, or Firm* — F. Chau & Associates, LLC

(57) ABSTRACT

In a method and device to align phases of a first clock signal and a second clock signal, include a phase detector, a delay generator, and a controller. The phase detector is configured to generate a preceding signal and a succeeding signal with respect to the first clock signal to detect a relationship between phases of the first clock signal and the second clock signal. The delay generator is configured to delay the first clock signal when the second clock signal falls behind the succeeding signal with respect to the first clock signal. The controller is configured to determine whether the phases of
(Continued)

the first clock signal and the second clock signal are aligned with each other according to the relationship detected by the phase detector.

22 Claims, 14 Drawing Sheets

(51) Int. Cl.
  *H03L 7/091* (2006.01)
  *G06F 1/08* (2006.01)
  *G06F 1/12* (2006.01)
(58) Field of Classification Search
  USPC .......................................................... 327/145
  See application file for complete search history.

(56) References Cited

U.S. PATENT DOCUMENTS

| | | | |
|---|---|---|---|
| 7,826,583 B2 | 11/2010 | Jeong et al. | |
| 8,179,181 B2* | 5/2012 | Lung | G06F 17/505 327/156 |
| 8,451,147 B2 | 5/2013 | Mazumdar et al. | |
| 9,142,656 B2 | 9/2015 | Streit | |
| 2011/0022934 A1* | 1/2011 | Oh | G06F 1/10 714/798 |
| 2016/0077546 A1* | 3/2016 | Herbeck | G06F 1/12 327/145 |

FOREIGN PATENT DOCUMENTS

| | | |
|---|---|---|
| JP | 5398113 | 1/2014 |
| KR | 1020080038777 | 5/2008 |
| KR | 1020120126244 | 11/2012 |
| KR | 1020150009181 | 1/2015 |

OTHER PUBLICATIONS

"Dynamic Clock Phase Alignment for Multiple Voltage Domains in Multi-Core Architecture" ISLPED '16, Aug. 8-10, 2016, San Francisco, CA.

Wang, Min, et al., "A Novel Configurable No Dead-Zone Digital Phase Detector Design", In Proc APCCAS, 2008, pp. 721-724.

* cited by examiner

FIG. 11

```
Algorithm 1: Phase manager behavior
Input: voltage level of core voltage domain Vcore
Output: phase alignment complete response
1: overlook ← 0
2: Delay selection value for variable delay element S ← 0
3. Pcur ← 2-bit output of phase detector corresponding to Vcore
4. Pprev ← Pcur
5. while Pcur! = (0,1) do
6.     If overlook = 0 then
7.         If Pcur = (1,1) and Pprev! = Pcur then
8:             overlook ← 1
9:             S ← S-2
10:        else S ← S+3 end if
11:    else S ← S+1 end if
12.    Pprev ← Pcur
13.    Pcur ← output of phase detector corresponding to Vcore
14. end while
```

METHOD AND DEVICE TO ALIGN PHASES OF CLOCK SIGNALS

CROSS-REFERENCE TO RELATED APPLICATIONS

This application claims priority under 35 USC 119(e) to U.S. Provisional Application No. 62/301,089, filed on Feb. 29, 2016, in the US Patent and Trademark Office and under 35 USC 119(a) to Korean Patent Application No. 10-2016-0081544, filed on Jun. 29, 2016, in the Korean Intellectual Property Office, the disclosures of which are incorporated herein in their entireties by reference.

1. Field

The present description relates to methods and devices to align phases of clock signals in a system using a plurality of clock signals.

2. Description of the Related Art

Due to technological developments, a system including a plurality of circuits, each using clock signals different from one another, is used in many applications. For example, a system on chip (SoC) including a plurality of processing cores is utilized in various systems such as a sensor note of a sensor network, a cell phone, a base station, a network router, and other electronic devices and networks. A processor architecture including the processing cores is referred to as a multiple core system. As each core of the multiple core system operates based on an independent clock signal, the multiple core system may simultaneously process a plurality of operations, and thus, the performance of the multiple core system may be markedly improved compared to a single core system.

However, because each core, bus, and memory included in the multiple core system uses an independent clock signal, all the independent clock signals have to be synchronized with one another to effectively and timely exchange data communication between the components of the multiple core system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there may be provided a device to align phases of a first clock signal and a second clock signal, the device including: a phase detector configured to generate a preceding signal and a succeeding signal with respect to the first clock signal to detect a relationship between phases of the first clock signal and the second clock signal; a delay generator configured to delay the first clock signal when the second clock signal falls behind the succeeding signal with respect to the first clock signal; and a controller configured to determine whether the phases of the first clock signal and the second clock signal may be aligned with each other according to the relationship detected by the phase detector.

A time difference between the preceding signal and the succeeding signal may be determined according to a voltage of the first clock signal.

A frequency of the first clock signal may increase and the time difference between the preceding signal and the succeeding signal may decrease upon a voltage of the first clock signal increasing.

The controller may be configured to determine that the phases of the first and second clock signals may be aligned with each other upon a leading edge of the second clock signal being in a phase alignment window generated based on the preceding signal and the succeeding signal.

The phase alignment window may be calculated by subtracting a sum of a setup time and a hold time of the phase detector from a difference between leading edges of the preceding signal and the succeeding signal.

The phase detector may include a first flip-flop and a second flip-flop, the preceding signal may be input as a clock signal to the first flip-flop, the succeeding signal may be input as a clock signal to the second flip-flop, and the second clock signal may be input as data to the first and second flip-flops.

The controller may be configured to output a control signal preceding the first clock signal to the delay generator upon the phase alignment window falling behind the leading edge of the second clock signal.

The controller may be configured to determine a delay degree of the second clock signal based on the relationship detected by the phase detector, and the delay generator may be configured to activate clock gating before selecting a delay degree of the first clock signal upon the delay degree of the first clock signal being changed, and deactivate the clock gating after selecting the delay degree of the first clock signal.

A frequency of the first clock signal may be lower than a frequency of the second clock signal, and the first clock signal may be a clock signal of a core and the second clock signal may be a clock signal of a cache.

The controller may be configured to repeatedly delay the first clock signal and input the delayed first clock signal to the phase detector, through the delay generator, until the controller determines that the phases of the first and second clock signals may be aligned with each other.

In accordance with another embodiment, there is provided method to align phases of a first clock signal and a second clock signal, the method including: generating a preceding signal and a succeeding signal with respect to the first clock signal; detecting a relationship between phases of the first clock signal and the second clock signal based on the preceding and succeeding signals; delaying the first clock signal upon the second clock signal falling behind the succeeding signal with respect to the first clock signal; and determining whether a phase of the delayed first clock signal and a phase of the second clock signal may be aligned with each other.

A time difference between the preceding signal and the succeeding signal may be determined according to a voltage of the first clock signal.

A frequency of the first clock signal may increase and the time difference between the preceding signal and the succeeding signal may decrease upon the voltage of the first clock signal increasing.

Determining that the phase of the delayed first clock signal and phase of the second clock signal may be aligned with each other upon a leading edge of the second clock signal being in a phase alignment window generated based on the preceding signal and the succeeding signal.

The phase alignment window may be calculated by subtracting a sum of a setup time and a hold time of the phase detector from a difference between leading edges of the preceding signal and the succeeding signal.

The phase detector may include a first flip-flop and a second flip-flop, the preceding signal may be input as a clock signal to the first flip-flop, the succeeding signal may be input as a clock signal to the second flip-flop, and the second clock signal may be input as data to the first and second flip-flops.

The method may also include: making the first clock signal precede the second clock signal upon the phase alignment window falling behind the leading edge of the second clock signal.

The method may also include: determining a delay degree of the second clock signal based on the detected relationship, and the delaying of the first clock signal may include: activating clock gating before selecting a delay degree of the first clock signal upon the delay degree of the first clock signal being changed; and deactivating the clock gating after selecting the delay degree of the first clock signal.

A frequency of the first clock signal may be less than a frequency of the second clock signal, and the first clock signal may be a clock signal of a core and the second clock signal may be a clock signal of a cache.

The delaying and the determining may be repeatedly performed until the phases of the first and second clock signals may be aligned with each other.

In accordance with an embodiment, there may be provided a non-transitory computer-readable storage medium storing instructions that, when executed by a processor, cause the processor to perform the method described above.

Other features and aspects will be apparent from the following detailed description, the drawings, and the claims.

BRIEF DESCRIPTION OF THE DRAWINGS

FIG. 11 is a view of a pseudo-code aligning phases of clock signals, according to an embodiment.

DETAILED DESCRIPTION

Figure 1:
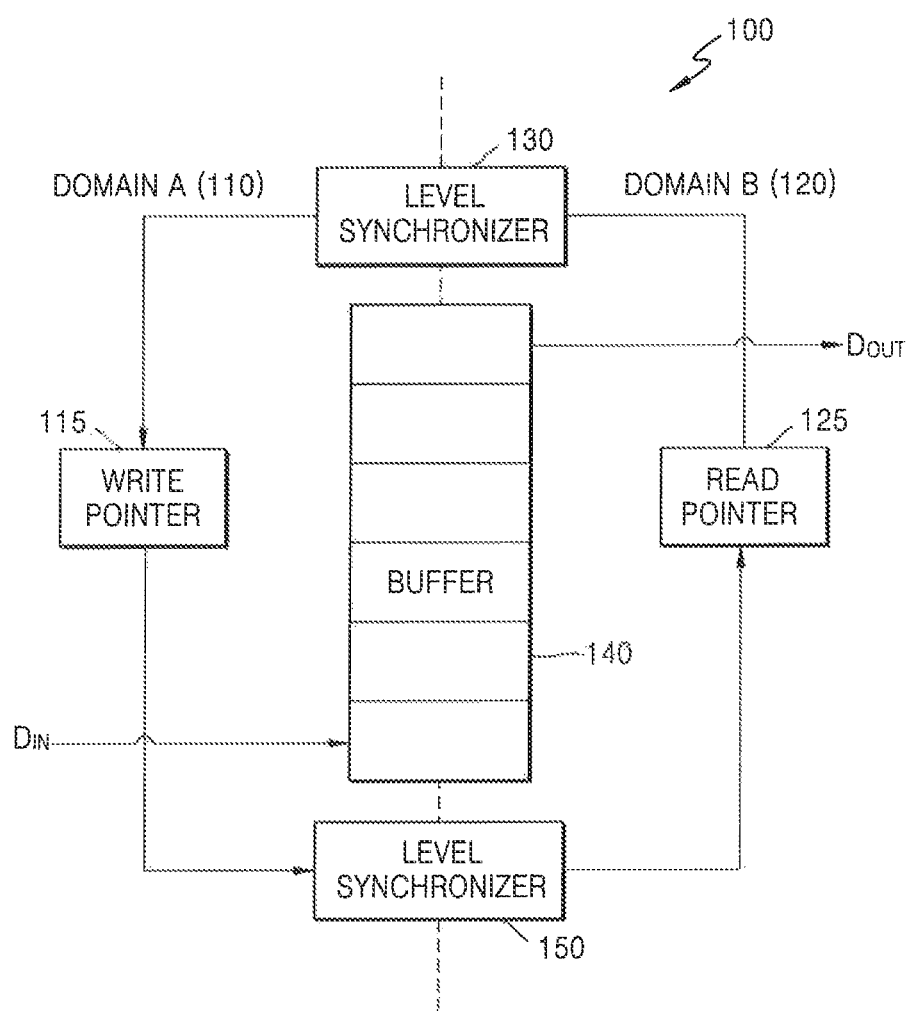
FIG. 1 is a view of a device performing data communication between two domains using clock signals different from each other.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view of a device performing data communication between two domains using clock signals different from each other.

Referring to FIG. 1, data is transmitted from a domain A 110 to a domain B 120. If the domain A 110 and the domain B 120 use clock signals having frequencies different from each other or if phases of the clock signals of the domain A 110 and the domain B 120 do not match each other, data may not be properly transmitted from the domain A 110 to the domain B 120. In one example, data communication between the two domains A 110 and B 120 is conducted using an asynchronous first in-first out (FIFO) device 100. The asynchronous FIFO device 100 includes a buffer 140 and level synchronizers 130 and 150 and operates as follows. Input data $D_{IN}$ to be transmitted from the domain A 110 to the domain B 120 are stored in the buffer 140, and a write pointer 115 is updated. The domain B 120 is notified via the level synchronizer 150 that the write pointer 115 is updated. Accordingly, output data $D_{OUT}$ is output from the buffer 140 to the output domain B 120, and a read pointer 125 is updated. The domain A 110 is notified via the level synchronizer 130 that the read pointer 125 is updated, and the write pointer 115 of the domain A 110 is moved to next data.

When data between the two domains A 110 to the domain B 120 needs to be continuously transmitted, the buffer 140 is used to store the data. However, a size of the buffer 140 increases according to a data size, and thus, a size of the entire system including the device 100 increases. Furthermore, because a time to update the write pointer 115 and the read pointer 125 is needed, a delay time between the input data $D_{IN}$ and the output data $D_{OUT}$ increase when the asynchronous FIFO device 100 is used.

Figure 2:
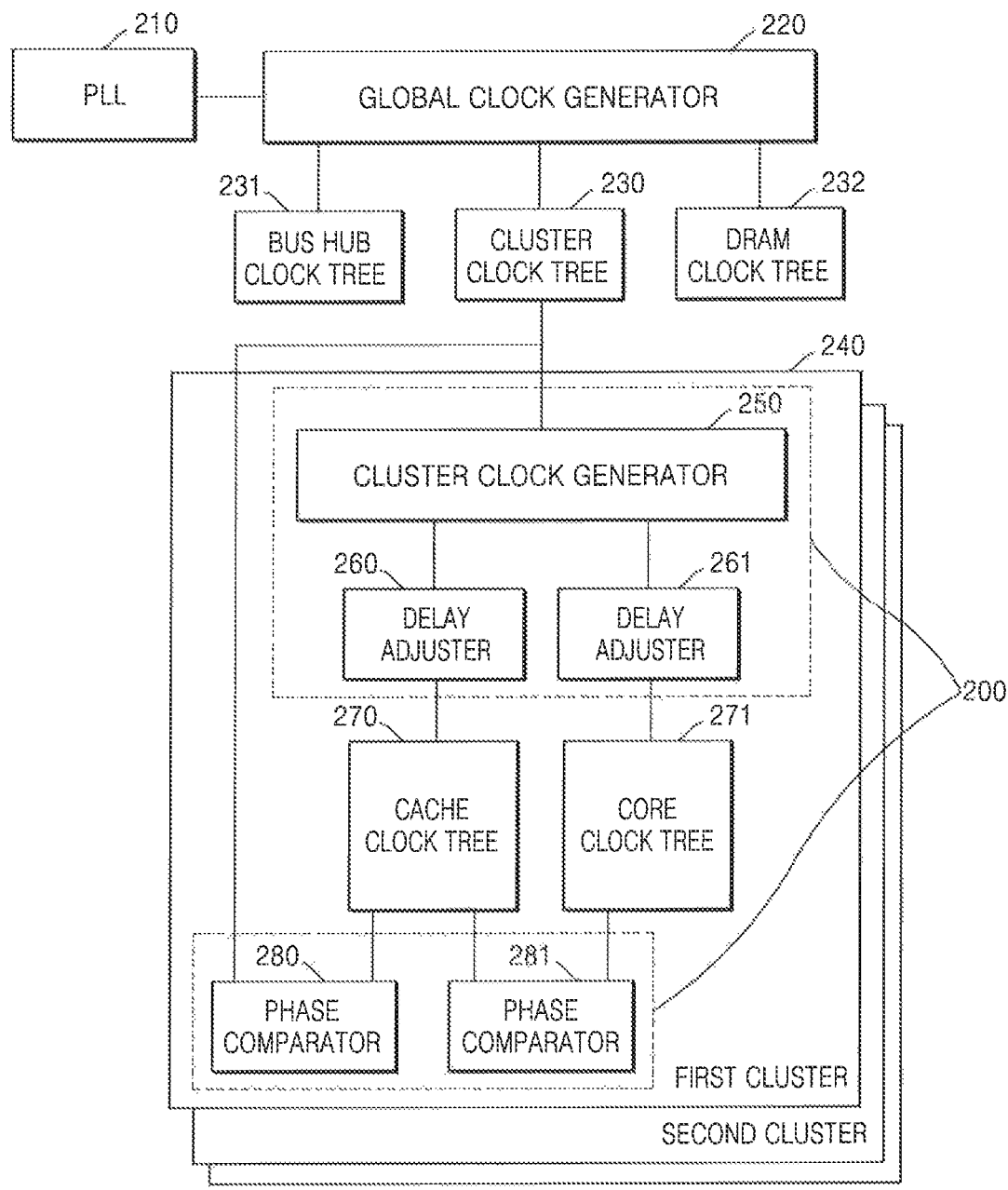
FIG. 2 is a view of another device performing data communication between two clock domains.

FIG. 2 is a view of another device performing data communication between two clock domains.

Referring to FIG. 2, a clock generator 200 aligns phases of clock signals that are different from one another to synchronize the clock signals. The clock generator 200 includes a cluster clock generator 250, delay adjusters 260 and 261, and phase comparators 280 and 281.

In more detail, the clock generator 200 of FIG. 2 includes a phase alignment device configured to align phases of clock signals by delaying a clock signal of one of domains via a tunable delay buffer, and compensates a phase difference between the delayed clock signal and a clock signal of another domain. When clock signals are different from each other by a multiple of 2, data communication between two domains may be possible without using an asynchronous FIFO device because leading edges of the clock signals match and phases of the clock signals are aligned as if the clock signals are synchronized. The leading edge indicates a point in time when a state of a signal changes from a higher state to a lower state, and may also be represented as a rising edge.

In more detail, a process to align phases of clock signals is performed as follows. An external clock signal passes through a phase locked loop (PLL) 210. The PLL 210 receives the external clock signal and generates an internal clock signal required for an internal operation of a system. Next, the clock signal output from the PLL 210 passes through a global clock generator 220. Furthermore, the global clock generator 220 generates a bus hub clock tree 231, a cluster clock tree 230, or a dynamic random access memory (DRAM) clock tree 232, according to internal components. Clusters of the cluster clock tree 230 include a plurality of cores each including a processor able to independently operate. Therefore, each of the clusters includes a cluster clock generator 250 and a core clock tree 271 corresponding to the cores included in each cluster.

Referring to FIG. 2, a first cluster 240 includes a cluster clock generator 250, a cache clock tree 270, and a core clock tree 271. Because a cache is required to have a processing speed higher than that of a core, a frequency of a cache clock signal output from the cache clock tree 270 is higher than that of a core clock signal output from the core clock tree 271. Therefore, when a phase difference between the cache clock signal and the core clock signal is detected by the phase comparators 280 and 281, the cluster clock generator 250 delays the core clock signal until when a phase of the core clock signal is aligned with that of the cache clock signal via the delay adjusters 260 and 261 based on the detected phase difference.

However, the delay adjusters 260 and 261 of the clock generator 200 are controlled according to an input of a user, and thus, it may be difficult to mass-produce the clock generator 200. Furthermore, it may be difficult to align phases of clock signals in dynamic voltage frequency scaling (DVFS) in which a voltage or a frequency changes during a circuit operation. Also, the phase comparators 280 and 281 may require a lot of time to detect a phase difference.

Figure 3:
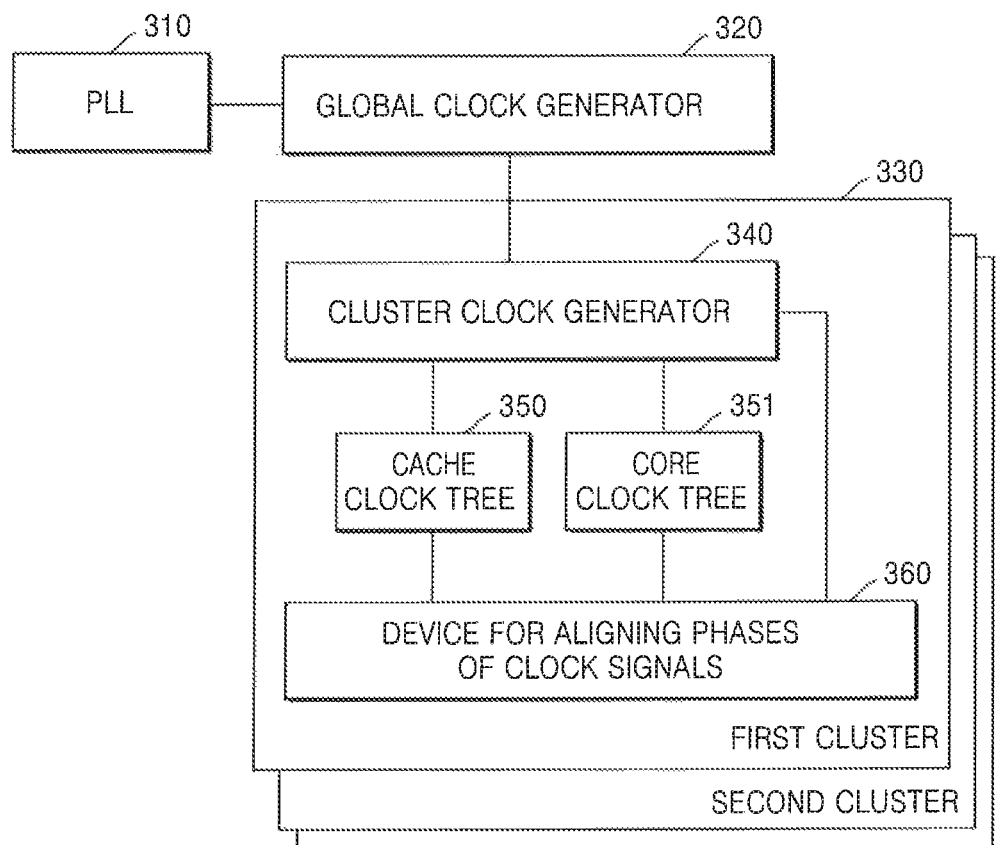
FIG. 3 is a view of a device to align phases of clock signals, according to an embodiment.

FIG. 3 is a view of a device 360 for aligning phases of clock signals, according to an embodiment.

FIG. 3 illustrates a PLL 310, a global clock generator 320, and a first cluster 330. The first cluster 330 includes a cluster clock generator 340, a cache clock tree 350, a core clock tree 351, and the device 360.

Referring to FIG. 3, the device 360 is configured to align phases of clock signals and is located in each cluster. Furthermore, the device 360 to align phases of clock signals receives output clock signals of the cache clock tree 350 and the core clock tree 351, detects a phase difference between the two clock signals, and controls the core clock tree 351 based on the detected phase difference. FIG. 3 illustrates the device 360 to align phases of clock signals on an assumption that the device 360 aligns phases of a cache clock signal and a core clock signal, but this is only for convenience of explanation and the embodiment is not limited thereto. For example, the device 360 to align phases of the clock signals may also align phases of two clock signals having frequencies different from each other as well as the cache clock signal and the core clock signal.

In an example, the device 360 to align phases of clock signals aligns phases by delaying the core clock signal, which is a clock signal having a relatively lower frequency. When the device 360 delays a clock signal having a relatively higher frequency, the clock signal having the relatively higher frequency includes a plurality of leading edges in a period of a clock signal having a lower frequency, and therefore, it is difficult to determine whether phases of these two clock signals are aligned or not with each other.

Hereinbelow, a first clock signal is discussed with a clock signal having a frequency less than that of a second clock signal.

Figure 4:
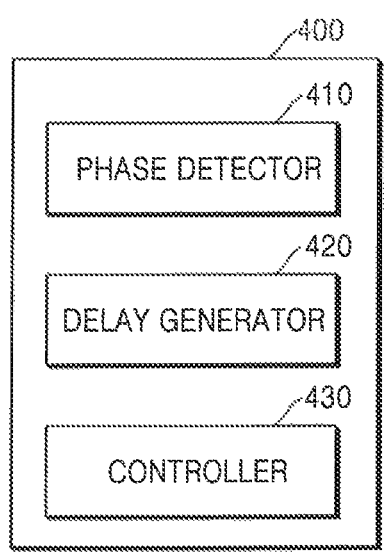
FIG. 4 is a block diagram of a device to align phases of clock signals, according to another embodiment.

FIG. 4 is a block diagram of a device 400 to align phases of clock signals, according to another embodiment.

Referring to FIG. 4, the device 400 to align phases of clock signals includes a phase detector 410, a delay generator 420, and a controller 430. The device 400 to align phases of clock signals of FIG. 4 includes certain structural components related to an embodiment. However, additional structural components may be further included in addition to the structural components shown in FIG. 4.

The phase detector 410 detects a relationship between phases of a first clock signal and a second clock signal. In more detail, the phase detector 410 generates a preceding signal and a succeeding signal with respect to the first clock signal, and detects a relationship between phases of the first clock signal and the second clock signal. The preceding signal, with respect to the first clock signal, indicates a signal preceding the first clock signal in time, and the succeeding signal, with respect to the first clock signal, indicates a signal delaying the first clock signal. Further, a time difference between the preceding signal and the succeeding signal, with respect to the first clock signal, is determined according to a voltage of the first clock signal. For example, a frequency of the first clock signal increases when the voltage of the first clock signal increases, but the time difference between the preceding signal and the succeeding signal with respect to the first clock signal is reduced.

Furthermore, the phase detector 410 includes a first flip-flop and a second flip-flop. The preceding signal, with respect to the first clock signal, is input as a clock signal to the first flip-flop. The succeeding signal, with respect to the first clock signal, is input as a clock signal to the second flip-flop, and the second clock signal is input as data to the first and second flip-flops. The phase detector 410 outputs two bits representing a relationship between phases of the first and second clock signals.

Furthermore, the phase detector 410 generates the preceding signal and the succeeding signal, with respect to the first clock signal, based on the voltage or frequency of the first clock signal, which varies or changes over time.

The delay generator 420 delays the first clock signal when the second clock signal falls behind the succeeding signal with respect to the first clock signal.

Furthermore, the delay generator 420 activates clock gating before selecting a delay degree of the first clock signal when the delay degree of the first clock signal is changed. Also, the delay generator 420 deactivates the clock gating after selecting the delay degree of the first clock signal.

The controller 430 determines whether the phase of the delayed first clock signal and the phase of the second clock signal are aligned with each other according to the relationship detected by the phase detector 410, and determines a delay degree of the second clock signal based on the relationship between phases of the first and second clock signals detected by the phase detector 410.

Furthermore, the controller 430 determines that the phase of the delayed first clock signal and the phase of the second clock signal are aligned with each other when a leading edge of the second clock signal is within a phase alignment window generated based on the preceding signal and the succeeding signal, with respect to the first clock signal. The phase alignment window is calculated by subtracting a sum of a setup time and a hold time of the phase detector 410 from a difference between leading edges of the preceding signal and the succeeding signal, with respect to the first clock signal.

Furthermore, the controller 430 outputs a control signal preceding the first clock signal to the delay generator 420 when the phase alignment window falls behind the leading edge of the second clock signal.

Figure 5A:
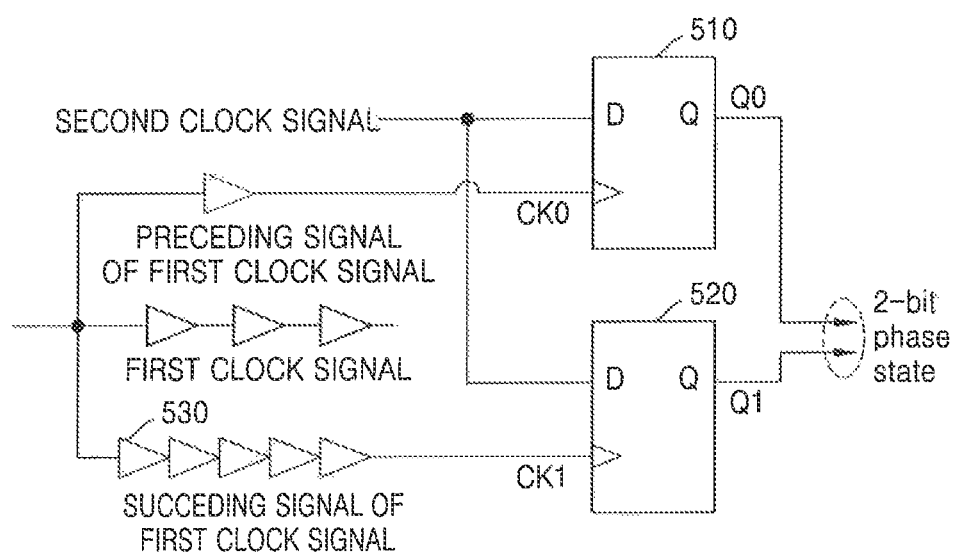
FIG. 5A is a view of a phase detector, according to an embodiment.

FIG. 5A is a view of the phase detector 410, according to an embodiment.

The phase detector 410 of the device 400 to align phases of clock signals includes a clock buffer 530, a first flip-flop 510, and a second flip-flop 520.

The clock buffer 530 is a buffer configured to delay a clock signal, where a number of clock buffers and a delay degree are configured to be proportional to each other. Furthermore, the clock buffer 530 includes a time delay circuit such as a thyristor-like delay circuit, but is not limited thereto.

A flip-flop, such as the first flip-flop 510 and the second flip-flop 520, is a logic circuit configured to store and maintain 1-bit information, and includes a latch, a D flip-flop, a T flip-flop, or a JK flip-flop. The D flip-flop receives a data signal D and a clock signal CK and outputs a 1-output bit Q. In more detail, the D flip-flop captures a value of the data signal D from an edge of the clock signal CK and reflects the value of the data signal D on the output bit Q. Furthermore, the output bit Q is maintained without change when the edge is not generated.

Referring to FIG. 5A, in one illustrative example, each of the first and second flip-flops 510 and 520 included in the phase detector 410 of the device 400 to align phases of clock signals is the D flip-flop, but it will be understood by those of ordinary skill in the art that the D flip-flop may be replaced by another type of flip-flop.

Referring to FIG. 5A, each data signal D of the first and second flip-flops 510 and 520 is a second clock signal. Furthermore, a clock signal CK0 of the first flip-flop 510 is a preceding signal with respect to a first clock signal, and a clock signal CK1 of the second flip-flop 520 is a succeeding signal with respect to the first clock signal. The first and second flip-flops 510 and 520 receive the data signal D and the clock signals CK0 and CK1, and output 1-output bits Q0 and Q1, respectively. The phase detector 410 (shown and described with respect to FIG. 4) combines the output bits Q0 and Q1, and outputs a 2-bit signal indicating a phase alignment state.

In addition, the device 400 to align phases of clock signals generates the preceding signal with respect to the first clock signal and generates the succeeding signal with respect to the first clock signal, and inputs the preceding signal with respect to the first clock signal to the clock signal CK0 of the first flip-flop 510. Therefore, even when a phase of the first clock signal and a phase of the second clock signal are already aligned with each other, the output bits Q0 and Q1 indicating that the phase alignment is completed is output.

Figure 5B:
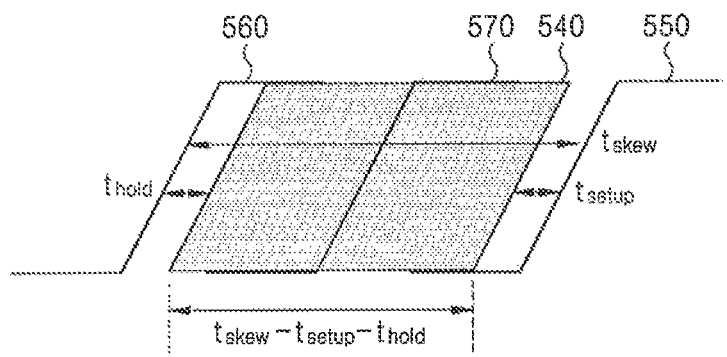
FIG. 5B is a view of a phase alignment window of the phase detector, according to an embodiment.

FIG. 5B is a view of a phase alignment window 540 of the phase detector 410, according to an embodiment.

The phase alignment window 540 indicates a time range in which a leading edge of the second clock signal exists when the phases of the first and second clock signals are determined to be aligned with each other. In other words, it is not until the leading edge of the second clock signal is in the phase alignment window 540 that the phase detector 410 outputs (0, 1), which are output bits Q0 and Q1 indicating that the phases of the first and second clock signals are aligned with each other.

In addition, a width $t_{window}$ of the phase alignment window 540 is as below.

$$t_{window} = t_{skew} - t_{setup} - t_{hold} \quad \text{[Equation 1]}$$

$t_{skew}$ indicates a time difference between leading edges of a preceding signal 560 and a succeeding signal 550 of the first clock signal. $t_{setup}$ and $t_{hold}$ indicate a time during which an input signal of a flip-flop needs to be constantly or consistently maintained so that the flip-flop is safely operated. That is, $t_{setup}$ indicates a minimum time interval during which the input signal of the flip-flop is not to be changed before a leading edge of a clock signal, and $t_{hold}$ indicates a minimum time interval during which the input signal of the flip-flop is not to be changed after a leading edge of a clock signal.

Referring to Equation 1, the width $t_{window}$ of the phase alignment window 540 is obtained by subtracting $t_{setup}$ and $t_{hold}$ from $t_{skew}$.

Figure 6A:
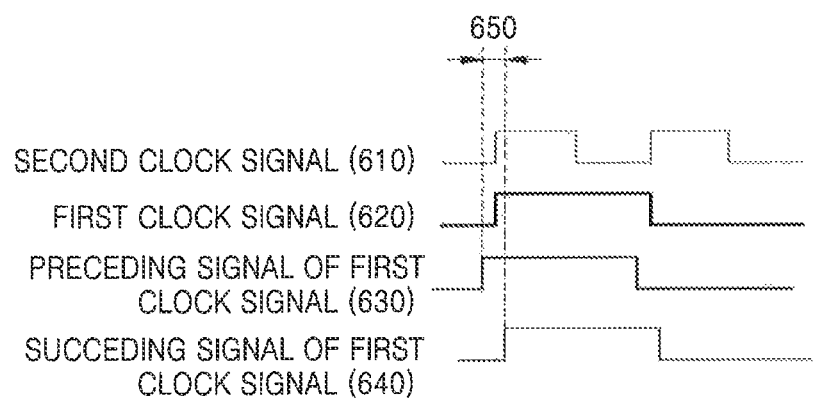
FIG. 6A is a view illustrating a relationship between first and second clock signals when output bits of a phase detector are (0, 1), according to an embodiment.
Figure 6B:
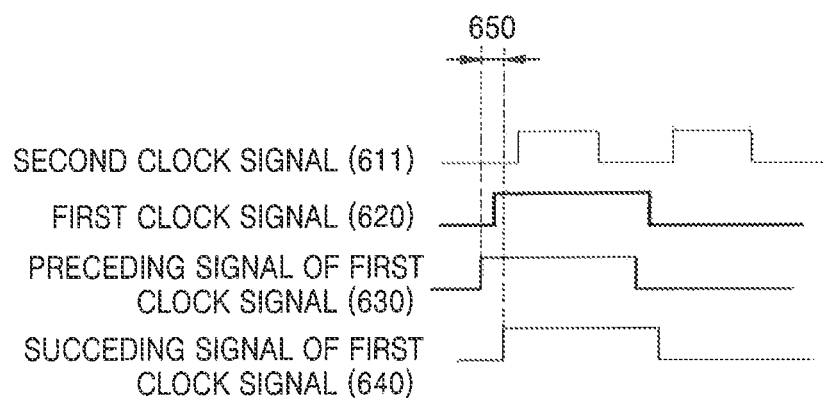
FIG. 6B is a view illustrating a relationship between first and second clock signals when output bits of the phase detector are (0, 0), according to another embodiment.
Figure 6C:
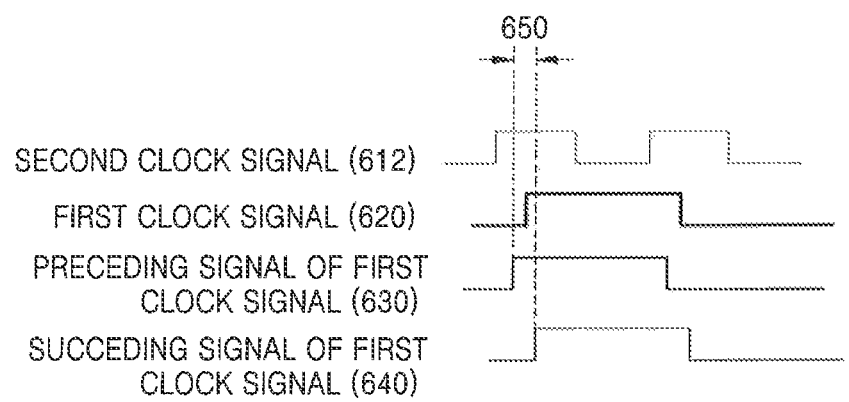
FIG. 6C is a view illustrating a relationship between first and second clock signals when output bits of the phase detector are (1,1), according to another embodiment.

FIGS. 6A to 6C are views illustrating a relationship between a first clock signal 620 and a second clock signal 610 according to the output bits Q0 and Q1 of the phase detector 410. For the sake of convenience, it is assumed in FIGS. 6A to 6C that a phase alignment window 650 is the same as a time interval ($t_{skew}$) of leading edges of a preceding signal, with respect to a first clock signal, and a succeeding signal, with respect to the first clock signal.

FIG. 6A is a view illustrating a relationship between the first clock signal 620 and the second clock signal 610 when output bits of the phase detector 410 are (0, 1), according to an embodiment.

As shown in FIG. 6A, a frequency of the second clock signal 610 is higher than a frequency of the first clock signal 620. Furthermore, a leading edge of the second clock signal 610 is located in the phase alignment window 650. Because a leading edge of a preceding signal 630 of the first clock signal is generated when the second clock signal 610 is 0, and a leading edge of a succeeding signal 640 of the first clock signal is generated when the second clock signal 610 is 1, output bits Q0 and Q1 of the phase detector 410 become (0, 1). Therefore, when the output bits Q0 and Q1 of the phase detector 410 are (0, 1), the controller 430 determines that phases of the first and second clock signals 620 and 610 are aligned based on the output bits Q0 and Q1.

FIG. 6B is a view illustrating a relationship between the first clock signal 620 and the second clock signal 610 when output bits of the phase detector 410 are (0, 0), according to another embodiment.

Referring to FIG. 6B, a leading edge of a second clock signal 611 falls behind the phase alignment window 650. Because both leading edges of a preceding signal 630 of the first clock signal and a succeeding signal 640 of the first clock signal are generated when the second clock signal 611 is 0, output bits Q0 and Q1 of the phase detector 410 become (0, 0). Therefore, the first clock signal 620 is to be delayed to align the phases of the first and second clock signals 620 and 611 with each other when the output bits Q0 and Q1 of the phase detector 410 are (0, 0).

FIG. 6C is a view illustrating a relationship between the first clock signal 620 and the second clock signal 610 when output bits of the phase detector are (1,1), according to another embodiment.

Referring to FIG. 6C, a leading edge of a second clock signal 612 precedes the phase alignment window 650. Because both leading edges of a preceding signal 630 of the first clock signal and the succeeding signal 640 of the first clock signal are generated when the second clock signal 612 is 1, output bits Q0 and Q1 of the phase detector 410 become (1, 1). Therefore, the first clock signal 620 is to be preceded to align the phases of the first and second clock signals 620 and 612 with each other when the output bits Q0 and Q1 of the phase detector 410 are (1, 1).

Figure 7:
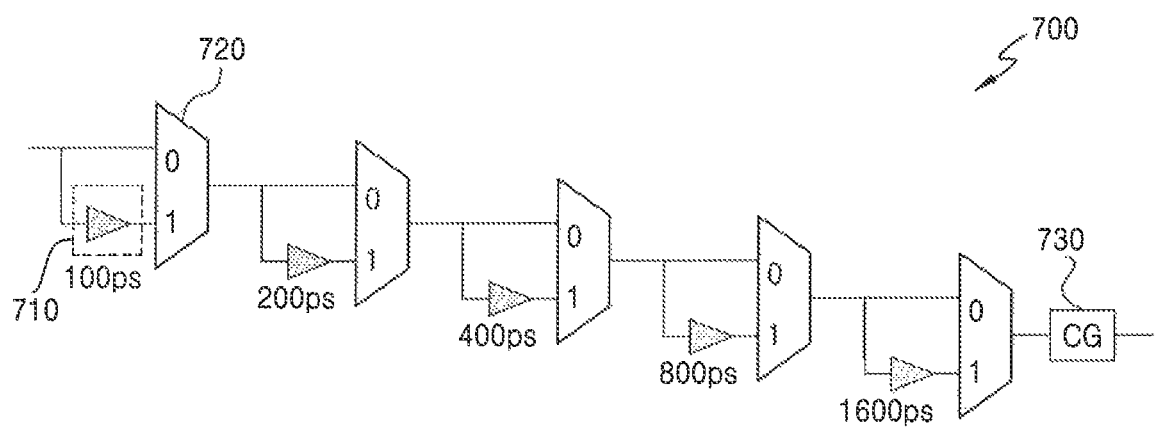
FIG. 7 is a view of a delay generator, according to an embodiment.

FIG. 7 is a view of a delay generator 700, according to an embodiment.

Referring to FIG. 7, the delay generator 700 includes a plurality of clock buffers 710 and multiplexers 720. The delay generator 700 of FIG. 7 includes five pairs of clock buffers 710 and multiplexers 720 and generates 32 different delays. The number of the clock buffers 710 and multiplexers 720 is not limited to the present embodiment. Furthermore, in accordance with another example, a delay generator configured to delay a clock signal, without using the clock buffers 710 and multiplexers 720, may be configured as the delay generator 700.

For example, the delay generator 700 of FIG. 7 delays the first clock signal by a multiple of a delay unit, and delays the first clock signal maximum about 3.2 ns on an assumption that a delay unit is 100 ns.

Because the clock buffers 710 corresponds to the clock buffer 530 of FIG. 5A, a detailed description thereof will not be given here. The multiplexers 720 help the delay generator 700 to determine a delay generated by each of the clock buffers 710 and generate delays with a variety of intervals. Further, the multiplexers 720 may be glitch-free clock multiplexers preventing a glitch phenomenon in advance or may be general multiplexers. However, when using general multiplexers, a glitch phenomenon may be generated when a previous state of the multiplexers is changed. In such instance, the glitch phenomenon may be solved by adding a clock gating cell 730 behind or before the last multiplexer. The clock gating cell 730 deactivates clock gating before changing a delay interval and activates the clock gating again after changing the delay interval.

Figure 8:
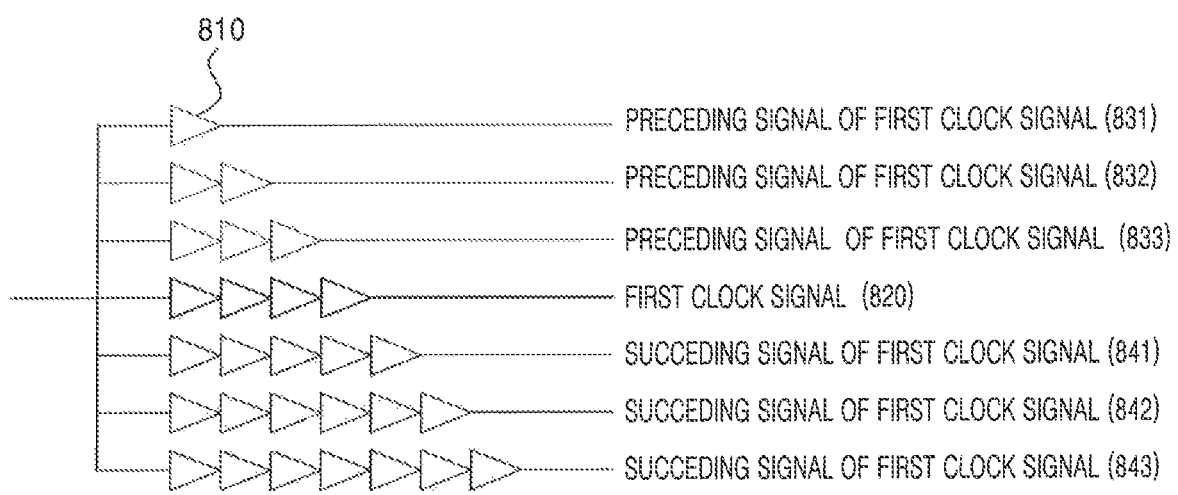
FIG. 8 is a view of a circuit generating preceding signals and succeeding signals with respect to a first clock signal of a phase detector, according to another embodiment.

FIG. 8 is a view of a circuit generating preceding signals and succeeding signals with respect to a first clock signal of the phase detector 410, according to another embodiment.

The phase detector 410 generates the preceding signals and succeeding signals of the first clock signal by using a plurality of clock buffers 810. In one example, a signal passing through four of the clock buffers 810 is referred to as a first clock signal 820, a first clock signal passing through three or less of the clock buffers 810 is referred to as preceding signals 831, 832, and 833 of the first clock signal, and a first clock signal passing through five or more of the clock buffers 810 is referred to as succeeding signals 841, 842, and 843 of the first clock signal.

The phase detector 410 determines a preceding degree and a delay degree of the first clock signal based on a voltage or a frequency of the first clock signal that changes over time. For example, a frequency of the first clock signal decreases when a voltage of a domain using the first clock signal is reduced. In an example, a phase alignment window with a larger width is used by using a preceding signal 831 of the first clock signal and a succeeding signal 843 of the first clock signal that has a relatively large time difference with the first clock signal 820. When a width of the phase alignment window increases, phases are aligned in a relatively short time because a phase alignment state may be determined at a time over a wide range period of time. On the contrary, a frequency of the first clock signal increases when a voltage of the domain using the first clock signal increases. In one example, a phase alignment window with a smaller width is used by using the preceding signal 833 of the first clock signal and the succeeding signal 841 of the first clock signal that have a relatively small time difference with the first clock signal 820. When a width of the phase alignment window becomes smaller, phases of clock signals having higher frequencies are efficiently aligned because a phase alignment state is determined over a shorter range period of time.

Furthermore, the phase detector 410 stores the preceding degree and delay degree of the first clock signal corresponding to the voltage in a table form, and determines the preceding degree and delay degree of the first clock signal based on a value of the voltage.

Figure 9:
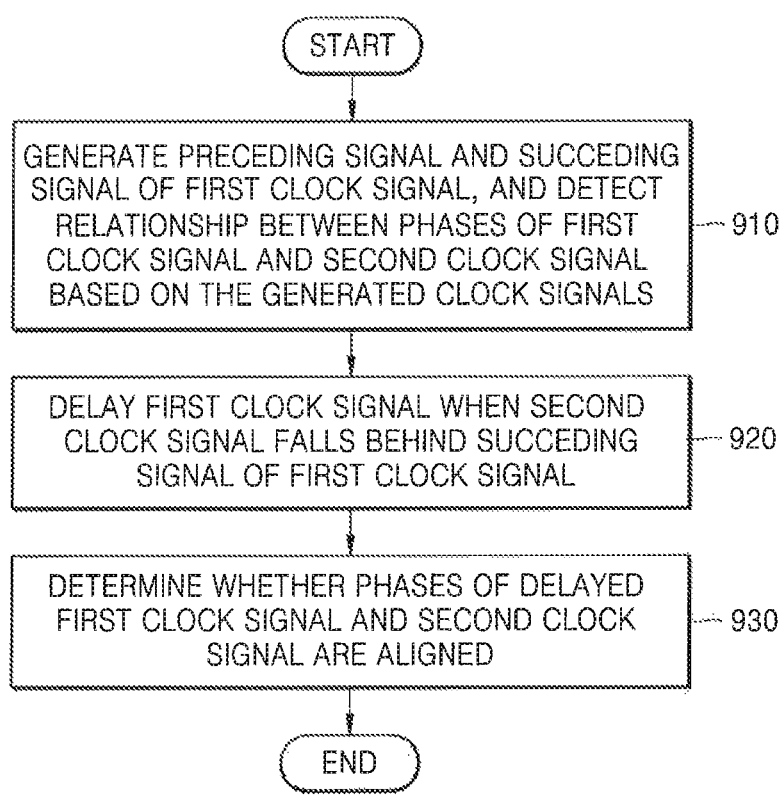
FIG. 9 is a flowchart illustrating a method to align phases of clock signals, according to an embodiment.

FIG. 9 is a flowchart illustrating a method to align phases of clock signals, according to an embodiment.

In operation 910, the phase detector 410 generates a preceding signal and a succeeding signal with respect to a first clock signal, and detects a relationship between phases of the first clock signal and a second clock signal based on the generated preceding and succeeding signals. A time difference between the preceding signal and the succeeding signal, with respect to the first clock signal, is determined according to a voltage of the first clock signal. For example, a frequency of the first clock signal increases when the voltage of the first clock signal increases, and a time difference between the preceding signal and the succeeding signal, with respect to the first clock signal, is reduced.

Furthermore, the preceding signal and succeeding signal, with respect to the first clock signal, generated by the phase detector 410 are generated based on the voltage or frequency of the first clock signal that changes over time.

In operation 920, the delay generator 420 delays the first clock signal when the second clock signal falls behind the succeeding signal with respect to the first clock signal. The device 400 to align phases of clock signals, when a phase alignment window falls behind a leading edge of the second clock signal, precedes the first clock signal. Furthermore, in operation 920, the device 400 to align phases of clock signals activates clock gating before selecting a delay degree of the first clock signal when the delay degree of the first clock signal is changed, and deactivates the clock gating after selecting the delay degree of the first clock signal.

In operation 930, the device 400 to align phases of clock signals determines whether a phase of the delayed first clock signal and a phase of the second clock signal are aligned with each other.

In an embodiment, operations 920 and 930 are repeatedly performed until the method determines that the phases of the first and second clock signals are aligned with each other.

Further, the controller 430 determines that the phases of the first and second clock signals are aligned with each other when a leading edge of the second clock signal is in a phase alignment window generated based on the preceding signal and the succeeding signal, with respect to the first clock signal. The phase alignment window is obtained by subtracting a sum of a setup time and a hold time of the phase detector 410 from a difference between leading edges of the preceding signal and the succeeding signal, with respect to the first clock signal.

Figure 10:
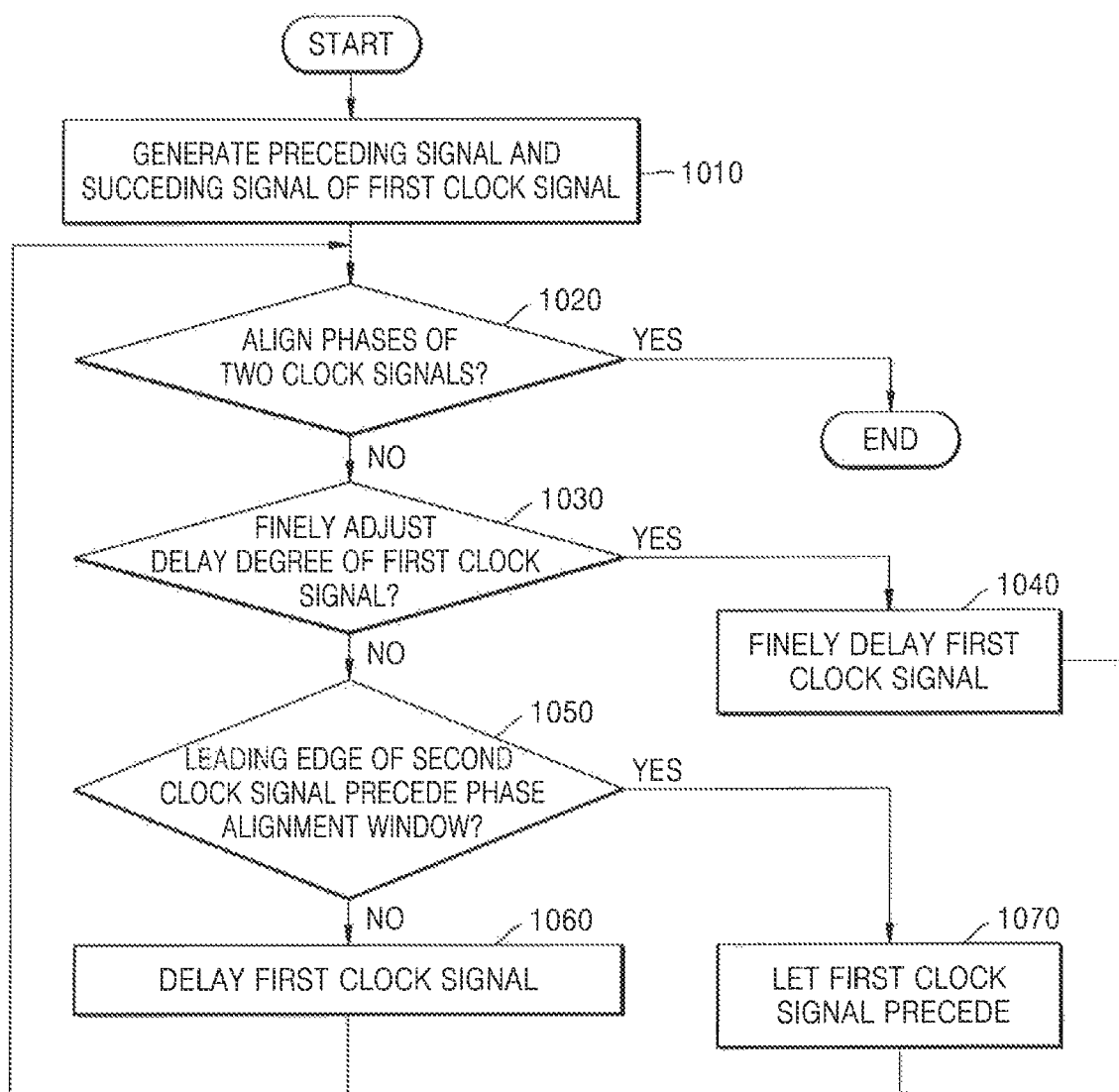
FIG. 10 is a flowchart illustrating a method to align phases of clock signals in detail, according to an embodiment.

FIG. 10 is a flowchart illustrating a method to align phases of clock signals in detail, according to an embodiment.

In operation 1010, the phase detector 410 generates a preceding signal and a succeeding signal with respect to a first clock signal. The phase detector 410 determines a preceding degree and delay degree of the first clock signal based on a voltage and frequency of the first clock signal.

In operation 1020, the controller 430 determines whether phases of the first and second clock signals are aligned based on a combination of the output bits Q0 and Q1 output from the phase detector 410. If the controller 430 determines that the phases of the first and second clock signals are aligned with each other, the method of FIG. 10 is terminated. However, if the controller 430 determines that the phases of the first and second clock signals are not aligned with each other, operation 1030 is executed. In more detail, the controller 430 determines that the phases of the first and second clock signals are aligned with each other when the output bits Q0 and Q1 of the phase detector 410 are (0, 1).

In operation 1030, the controller 430 determines whether there is a need to finely adjust the delay degree of the first clock signal. If the phase detector 410 determines that a second clock signal precedes a phase alignment window and let the first clock signal precede, the controller 430 determines that the delay degree of the first clock signal is to be finely adjusted. If the delay degree of the first clock signal is to be finely adjusted, operation 1040 is executed. However, if there is no need to finely adjust the delay degree of the first clock signal, operation 1050 is executed.

In operation 1040, the controller 430 controls the delay generator 420 to finely delay the first clock signal and performs operation 1020. A fine delay represents a delay unit. For example, the delay generator 420 delays the first clock signal by delay units in operation 1040. A value of a delay unit changes according to a voltage of a domain using a clock signal and a frequency of the clock signal.

In operation 1050, the controller 430 determines whether a leading edge of the second clock signal precedes the phase alignment window. The controller 430 determines that the leading edge of the second clock signal precedes the phase alignment window when the output bits Q0 and Q1 of the phase detector 410 are (1, 1). Operation 1070 is executed in response to the leading edge of the second clock signal preceding the phase alignment window, or operation 1060 is executed.

In operation 1060, the controller 430 controls the delay generator 420 to delay the first clock signal and performs operation 1020.

In operation 1070, the controller 430 controls the delay generator 420 to let the first clock signal precede and performs operation 1020.

FIG. 11 is a view of a pseudo-code aligning phases of clock signals, according to an embodiment.

The pseudo-code of FIG. 11 indicates a method to align phases of a cache clock signal and a core clock signal. In one illustrative example, the phases of the first and second clock signals are aligned with each other as long as a frequency of the second clock signal is a constant multiple of that of the first clock signal.

The device 400 to align phases of clock signals receives a voltage $V_{core}$ of a core clock domain, and determine a preceding degree of the preceding signal with respect to the first clock signal and a delay degree of the succeeding signal with respect to the first clock signal that are generated in the phase detector 410.

Furthermore, S indicates a delay interval generated by the delay generator 420. For example, when S is 3, the delay generator 420 generates delays corresponding to three delay units. $P_{cur}$ indicates current output bits Q0 and Q1 output from the phase detector 410, and $P_{prev}$ indicates output bits Q0 and Q1 before $P_{cur}$. "overlook" indicates a variable storing 1 when a second clock signal precedes a phase alignment window.

Referring to FIG. 11, when a leading edge of the second clock signal falls behind the phase alignment window, the controller 430 repeatedly delays the first clock signal by a value corresponding to three delay units. When the leading edge of the second clock signal precedes the phase alignment window for the first time, 1 is stored in "overlook" and 2 is subtracted from S, and thus, the first clock signal precedes the second clock. Further, the delay interval is changed to delay units, and the controller 430 repeatedly delays the first clock signal until when the phases of the first and second clock signals are aligned with each other while checking a phase alignment state based on the output bits Q0 and Q1 of the phase detector 410.

As described above, phases of first and second clock signals are aligned by delaying the first clock signal without an input from a user, and thus, a synchronization effect is generated when transmitting and receiving data between domains using clock signals, different from each other.

The PLL 210, the global clock generator 220, the bus hub clock tree 231, the cluster clock tree 230, the DRAM clock tree 232, every structural element included in the clock generator 200 illustrated and described with respect to FIG. 2, the PLL 310, the global clock generator 320, every structural element included in the first cluster 330 illustrated and described with respect to FIG. 3, the phase detector 410, the delay generator 420, the controller 430, and the flip-flops 510 and 520 in FIGS. 2 through 5A that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 9-11 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A device to align phases of a first clock signal and a second clock signal, the device comprising:
   a phase detector configured to generate a preceding signal and a succeeding signal with respect to the first clock signal to detect a relationship between phases of the first clock signal and the second clock signal;
   a delay generator configured to delay the first clock signal when the second clock signal falls behind the succeeding signal with respect to the first clock signal; and
   a controller configured to determine whether the phases of the first clock signal and the second clock signal are aligned with each other according to the relationship detected by the phase detector,
   wherein the first clock signal is generated by passing through a first number of clock buffers, the preceding signal is generated by passing through a second number of clock buffers and the succeeding signal is generated by passing through a third number of clock buffers,
   wherein the second number is less than the first number and the third number is greater than the first number,
   wherein the delay generator includes a plurality of multiplexers connected to each other in sequence, and
   wherein the plurality of multiplexers determines a delay of the first clock signal.

2. The device of claim 1, wherein a time difference between the preceding signal and the succeeding signal is determined according to a voltage of the first clock signal.

3. The device of claim 2, wherein a frequency of the first clock signal increases and the time difference between the preceding signal and the succeeding signal decreases upon a. voltage of the first clock signal increasing.

4. The device of claim 1, wherein the controller is configured to determine that the phases of the first and second clock signals are aligned with each other upon a leading edge of the second clock signal being in a phase alignment window generated based on the preceding signal and the succeeding signal.

5. The device of claim 4, wherein the phase alignment window is calculated by subtracting a sum of a setup time and a hold time of the phase detector from a difference between leading edges of the preceding signal and the succeeding signal.

6. The device of claim 1, wherein the phase detector comprises a first flip-flop and a second flip-flop, the preceding signal is input as a clock signal to the first flip-flop, the succeeding signal is input as a clock signal to the second flip-flop, and the second clock signal is input as data to the first and second flip-flops.

7. The device of claim 1, wherein the controller is configured to output a control signal preceding the first clock signal to the delay generator upon the phase alignment window falling behind the leading edge of the second clock signal.

8. The device of claim 1, wherein the controller is configured to determine a delay degree of the second clock signal based on the relationship detected by the phase detector, and the delay generator is configured to activate a clock gating cell before selecting a delay degree of the first clock signal upon the delay degree of the first clock signal being changed, and deactivate the clock gating cell after selecting the delay degree of the first clock signal.

9. The device of claim 1, wherein a frequency of the first clock signal is lower than a frequency of the second clock signal, and the first clock signal is a clock signal of a core and the second clock signal is a clock signal of a cache.

10. The device of claim 1, wherein the controller is configured to repeatedly delay the first clock signal and input the delayed first clock signal to the phase detector, through the delay generator, until the controller determines that the phases of the first and second clock signals are aligned with each other.

11. The device of claim 1, wherein the phase detector outputs first and second bits representing the relationship between the phases of the first clock signal and the second clock signal, wherein when a leading edge of the second clock signal, a leading edge of the preceding signal and a leading edge of the succeeding signal are located in a phase alignment window, the first bit has a first value and the second bit has a second value,
   the first value corresponding to a level of the second clock signal in the phase alignment window at the leading edge of the preceding signal in the phase alignment window, the second value correspond to a level of the second clock signal in the phase alignment window at the leading edge of the succeeding signal in the phase alignment window.

12. A method to align phases of a first clock signal and a second clock signal, the method comprising:
   generating a preceding signal and a succeeding signal with respect to the first clock signal;
   detecting a relationship between phases of the first clock signal and the second clock signal based on the preceding and succeeding signals;
   delaying the first clock signal upon the second clock signal falling behind the succeeding signal with respect to the first clock signal; and determining whether a phase of the delayed first clock signal and a phase of the second clock signal are aligned with each other, wherein the first clock signal is generated by passing through a first number of clock buffers, the preceding signal is generated by passing through a second number of clock buffers and the succeeding signal is generated by passing through a third number of clock buffers, wherein the second number is less than the first number and the third number is greater than the first number, wherein the first clock signal is delayed by using a plurality of multiplexers connected to each other in sequence, and wherein the plurality of multiplexers determines a delay of the first clock signal.

13. The method of claim 12, wherein a time difference between the preceding signal and the succeeding signal are determined according to a voltage of the first clock signal.

14. The method of claim 13, wherein a frequency of the first clock signal increases and the time difference between the preceding signal and the succeeding signal decreases upon the voltage of the first clock signal increasing.

15. The method of claim 12, wherein determining that the phase of the delayed first clock signal and phase of the second clock signal are aligned with each other upon a leading edge of the second clock signal being in a phase alignment window generated based on the preceding signal and the succeeding signal.

16. The method of claim 15, wherein the phase alignment window is calculated by subtracting a sum of a setup time and a hold time of the phase detector from a difference between leading edges of the preceding signal and the succeeding signal.

17. The method of claim 12, wherein the phase detector comprises a first flip-flop and a second flip-flop, the preceding signal is input as a clock signal to the first flip-flop, the succeeding signal is input as a clock signal to the second flip-flop, and the second clock signal is input as data to the first and second flip-flops.

18. The method of claim 12, further comprising: making the first clock signal precede the second clock signal upon the phase alignment window falling behind the leading edge of the second clock signal.

19. The method of claim 12, further comprising:

determining a delay degree of the second clock signal based on the detected relationship, and the delaying of the first clock signal comprises:

activating a clock gating cell before selecting a delay degree of the first clock signal upon the delay degree of the first clock signal being changed; and deactivating the clock gating cell after selecting the delay degree of the first clock signal.

20. The method of claim 12, wherein a frequency of the first clock signal is less than a frequency of the second clock signal, and the first clock signal is a clock signal of a core and the second clock signal is a clock signal of a cache.

21. The method of claim 12, wherein the delaying and the determining are repeatedly performed until the phases of the first and second clock signals are aligned with each other.

22. A non-transitory computer-readable storage medium storing instructions that, when executed by a processor, cause the processor to perform the method of claim 12.

* * * * *